(12) United States Patent
Yang et al.

(10) Patent No.: US 12,490,588 B2
(45) Date of Patent: Dec. 2, 2025

(54) DISPLAY PANEL AND MANUFACTURING METHOD THEREOF, AND DISPLAY DEVICE

(71) Applicant: BOE TECHNOLOGY GROUP CO., LTD., Beijing (CN)

(72) Inventors: Ming Yang, Beijing (CN); Zhenyu Zhang, Beijing (CN); Chuanxiang Xu, Beijing (CN); Fuqiang Li, Beijing (CN); Yawei Wang, Beijing (CN); Chenyang Zhang, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 587 days.

(21) Appl. No.: 17/907,027

(22) PCT Filed: Oct. 22, 2021

(86) PCT No.: PCT/CN2021/125734
§ 371 (c)(1),
(2) Date: Sep. 22, 2022

(87) PCT Pub. No.: WO2022/160801
PCT Pub. Date: Aug. 4, 2022

(65) Prior Publication Data
US 2023/0132313 A1    Apr. 27, 2023

(30) Foreign Application Priority Data

Jan. 26, 2021  (CN) .......................... 202110105622.0

(51) Int. Cl.
*H10K 59/121* (2023.01)
*H10K 59/123* (2023.01)
*H10K 59/131* (2023.01)

(52) U.S. Cl.
CPC ....... *H10K 59/121* (2023.02); *H10K 59/1213* (2023.02); *H10K 59/123* (2023.02); *H10K 59/131* (2023.02)

(58) Field of Classification Search
CPC ..... H10K 59/121–1216; H10K 59/123; H10K 59/131
See application file for complete search history.

(56) References Cited

U.S. PATENT DOCUMENTS

2015/0279884 A1  10/2015  Kusumoto
2022/0336573 A1  10/2022  Chen et al.

FOREIGN PATENT DOCUMENTS

| CN | 110993680 A | * | 4/2020 | ............ G09F 9/301 |
| CN | 111584591 A |   | 8/2020 | |

(Continued)

OTHER PUBLICATIONS

Chinese Application No. 202110105622.0, Notification of Rejection, Oct. 10, 2022.

(Continued)

*Primary Examiner* — Daniel P Shook
(74) *Attorney, Agent, or Firm* — DINSMORE & SHOHL LLP

(57) ABSTRACT

A display panel and a manufacturing method thereof, and a display device. The display panel includes: a base substrate including a display area including a first and a second display area; a first group of light-emitting devices located at the first display area; a first group of pixel driving circuits located at the second display area, configured to drive at least one first light-emitting device; a second group of light-emitting devices located at the second display area; and a second group of pixel driving circuits located at the second display area, and including a plurality of second pixel driving circuits configured to drive the plurality of second light-emitting devices. In a direction perpendicular to the (Continued)

base substrate, one group of pixel driving circuits of the first and second group of pixel driving circuits is located between the other group of pixel driving circuits and the base substrate.

20 Claims, 6 Drawing Sheets

(56) References Cited

FOREIGN PATENT DOCUMENTS

| | | | |
|---|---|---|---|
| CN | 111627962 | A | 9/2020 |
| CN | 111769148 | A | 10/2020 |
| CN | 112117320 | A | 12/2020 |
| CN | 112151588 | A | 12/2020 |
| CN | 112909056 | A | 6/2021 |
| KR | 20150002344 | A | 1/2015 |
| KR | 20180006543 | A | 1/2018 |

OTHER PUBLICATIONS

Chinese Application No. 202110105622.0, First Office Action, Apr. 29, 2022.

* cited by examiner

DISPLAY PANEL AND MANUFACTURING METHOD THEREOF, AND DISPLAY DEVICE

CROSS-REFERENCE TO RELATED APPLICATIONS

The present application is a U.S. National Stage Application under 35 U.S.C. § 371 of International Patent Application No. PCT/CN2021/125734, filed on Oct. 22, 2021, which claims priority to China Patent Application No. 202110105622.0 filed on Jan. 26, 2021, the entire disclosures of both of which are incorporated by reference.

TECHNICAL FIELD

The present disclosure relates to a display panel and a manufacturing method thereof, and a display device.

BACKGROUND

With the development of the display technology, full screen has become a development trend of the display screen. Additional devices, such as camera, are required to be provided in certain areas of the display screen. Such devices challenge further development of full screen.

SUMMARY

According to one aspect of the embodiments of the present disclosure, a display panel is provided. The display panel comprises: a base substrate comprising a display area, wherein the display area comprises a first display area and a second display area other than the first display area; a first group of light-emitting devices located at the first display area, and comprising a plurality of first light-emitting devices; a first group of pixel driving circuits located at the second display area, configured to drive at least one of the plurality of first light-emitting devices, and comprising at least one first pixel driving circuit; a second group of light-emitting devices located at the second display area, and comprising a plurality of second light-emitting devices; and a second group of pixel driving circuits located at the second display area, and comprising a plurality of second pixel driving circuits configured to drive the plurality of second light-emitting devices, wherein in a direction perpendicular to the base substrate, one group of pixel driving circuits of the first group of pixel driving circuits and the second group of pixel driving circuits is located between the base substrate and the other group of pixel driving circuits of the first group of pixel driving circuits and the second group of pixel driving circuits.

In some embodiments, the plurality of first light-emitting devices comprises a first group of first light-emitting devices and a second group of first light-emitting devices; the at least one first pixel driving circuit comprises: a first group of first pixel driving circuits configured to drive the first group of first light-emitting devices, and a second group of first pixel driving circuits configured to drive the second group of first light-emitting devices; and the display panel further comprises: a first group of first signal lines electrically connected to the first group of first pixel driving circuits, a first group of second signal lines electrically connected to the first group of first light-emitting devices and electrically connected to the first group of first signal lines through a first group of via holes, a second group of first signal lines electrically connected to the second group of first pixel driving circuits, and a second group of second signal lines electrically connected to the second group of first light-emitting devices, and electrically connected to the second group of first signal lines through a second group of via holes.

In some embodiments, at least one group of second signal lines of the first group of second signal lines or the second group of second signal lines comprises: a first subgroup of second signal lines; and a second subgroup of second signal lines located in different layers from the first subgroup of second signal lines.

In some embodiments, the first group of first signal lines is located on one side of the first group of first pixel driving circuits away from the second group of first pixel driving circuits; the first group of second signal lines is located on one side of the first group of first light-emitting devices away from the second group of first light-emitting devices; the second group of first signal lines is located on one side of the second group of first pixel driving circuits away from the first group of first pixel driving circuits; and the second group of second signal lines is located on one side of the second group of first light-emitting devices away from the first group of first light-emitting devices.

In some embodiments, each of the first group of first signal lines comprises: a first portion extending along a first direction, and electrically connected to one first pixel driver circuit in the first group of first pixel driver circuits; and a second portion electrically connected to the first portion, extending along a second direction different from the first direction, and electrically connected to one second signal line in the first group of second signal lines through one via hole in the first group of via holes.

In some embodiments, each of second group of first signal lines comprises: a third portion extending along the first direction, and electrically connected to one first pixel driving circuit in the second group of first pixel driving circuits; and a fourth portion electrically connected to the third portion, extending along the second direction, and electrically connected to one second signal line in the second group of second signal lines through one via hole in the second group of via holes.

In some embodiments, the first group of second signal lines and the second group of second signal lines extend along the first direction.

In some embodiments, the display panel further comprises: a plurality of third signal lines electrically connected to the first group of pixel driving circuits; and a plurality of fourth signal lines electrically connected to the second group of pixel driving circuits, wherein a first group of fourth signal lines in the plurality of fourth signal lines is electrically connected to the plurality of third signal lines and located in different layers from the plurality of third signal lines.

In some embodiments, orthographic projections of the plurality of third signal lines on the base substrate do not overlap with the first display area; and orthographic projections of the plurality of fourth signal lines on the base substrate do not overlap with the first display area.

In some embodiments, the plurality of third signal lines comprises a plurality of third signal lines of a first type and a plurality of third signal lines of a second type; and the first group of fourth signal lines comprises a plurality of fourth signal lines of the first type and a plurality of fourth signal lines of the second type, wherein the plurality of fourth signal lines of the first type is electrically connected to the plurality of third signal lines of the first type, and the plurality of fourth signal lines of the second type is electrically connected to the plurality of third signal lines of the second type.

In some embodiments, a distance between adjacent third signal lines of the first type in the plurality of third signal lines of the first type is greater than a distance between adjacent fourth signal lines of the first type in the plurality of fourth signal lines of the first type; and a distance between adjacent third signal lines of the second type in the plurality of third signal lines of the second type is greater than a distance between adjacent fourth signal lines of the second type in the plurality of fourth signal lines of the second type.

In some embodiments, the display panel further comprises: a plurality of fifth signal lines electrically connected to the first group of pixel driving circuits and extending along a first direction, wherein orthographic projections of the plurality of fifth signal lines on the base substrate overlap with an orthographic projection of the first group of pixel driving circuits on the base substrate; a plurality of sixth signal lines electrically connected to the second group of pixel driving circuits and extending along the first direction, wherein orthographic projections of the plurality of sixth signal lines on the base substrate do not overlap with the first display area; and a plurality of seventh signal lines electrically connected between the plurality of fifth signal lines and a first group of sixth signal lines in the plurality of sixth signal lines, the plurality of seventh signal lines extending along a second direction different from the first direction.

In some embodiments, the plurality of seventh signal lines is located in different layers from the plurality of fifth signal lines, and the plurality of seventh signal lines is located in different layers from the plurality of sixth signal lines.

In some embodiments, an orthographic projection of each of the plurality of seventh signal lines on the base substrate overlaps with an orthographic projection of at least one of the plurality of fifth signal lines on the base substrate, and overlaps with an orthographic projection of at least one of plurality of sixth signal lines on the base substrate.

In some embodiments, the plurality of fifth signal lines, the plurality of sixth signal lines and the plurality of seventh signal lines comprise at least one of a gate line, a light-emitting control line, a reset line, or an initialization line.

In some embodiments, orthographic projections of the second group of pixel driving circuits on the base substrate does not overlap with that of the first group of pixel driving circuits on the base substrate.

In some embodiments, a number of the plurality of second light-emitting devices is greater than a number of the plurality of first light-emitting devices; a number of the plurality of second pixel driving circuits is greater than a number of the at least one first pixel driving circuit; and in the direction perpendicular to the base substrate, the first group of pixel driving circuits is located between the second group of pixel driving circuits and the base substrate.

According to another aspect of the embodiments of the present disclosure, a display device is provided. The display device comprises: the display panel according to any one of the embodiments described above.

In some embodiments, the display device further comprises: a camera located on one side of the base substrate away from the first group of light-emitting devices and located at the first display area.

According to another aspect of the embodiments of the present disclosure, provided is a manufacturing method of a display panel, comprising: providing a base substrate comprising a display area, wherein the display area comprises a first display area and a second display area other than the first display area; and forming a first group of light-emitting devices located at the first display area, a first group of pixel driving circuits located at the second display area, a second group of light-emitting devices located at the second display area, and a second group of pixel driving circuits located at the second display area. The first group of light-emitting devices comprises a plurality of first light-emitting devices, the first group of pixel driving circuits is configured to drive at least one of the plurality of first light-emitting devices, and comprises at least one first pixel driving circuit, the second group of light-emitting devices comprises a plurality of second light-emitting devices, the second group of pixel driving circuits comprises a plurality of second pixel driving circuits configured to drive the plurality of second light-emitting devices. In a direction perpendicular to the base substrate, one group of pixel driving circuits of the first group of pixel driving circuits and the second group of pixel driving circuits is located between the base substrate and the other group of pixel driving circuits of the first group of pixel driving circuits and the second group of pixel driving circuits.

Other features, aspects and advantages of the present disclosure will become apparent from the following detailed description of exemplary embodiments of the present disclosure with reference to the accompanying drawings.

BRIEF DESCRIPTION OF THE ACCOMPANYING DRAWINGS

The accompanying drawings, which constitute part of this specification, illustrate exemplary embodiments of the present disclosure and, together with this specification, serve to explain the principles of the present disclosure.

The present disclosure can be more clearly understood from the following detailed description with reference to the accompanying drawings, in which.

Figure 1A:
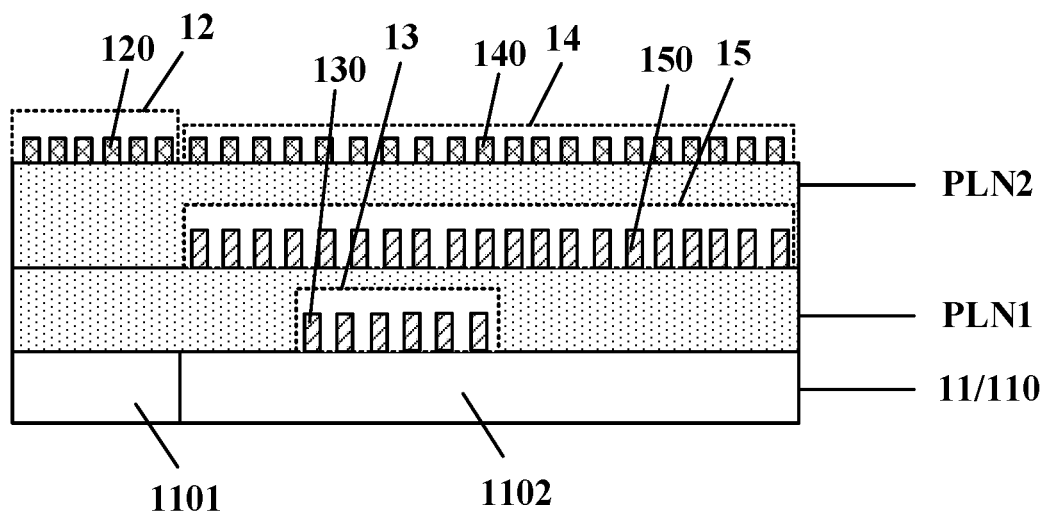
FIG. 1A is a schematic structural view showing a display panel according to an embodiment of the present disclosure.

It should be understood that the same or similar components are denoted by the same or similar reference signs.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventors have noticed that, for an area of the display panel in which a device such as a camera is provided, such an area is required to display normally when the device is not in operation and required to present high light transmittance when the device is in operation.

In view of the above, the embodiments of the present disclosure provide the following technical solutions.

Figure 1B:
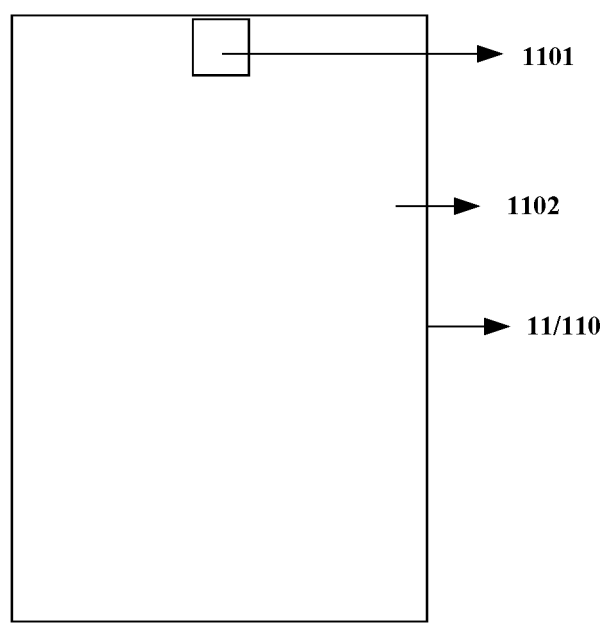
FIG. 1B is a schematic structural view showing a base substrate according to an embodiment of the present disclosure.

FIG. 1A is a schematic structural view showing a display panel according to an embodiment of the present disclosure. FIG. 1B is a schematic structural view showing a base substrate according to an embodiment of the present disclosure.

The display panel according to some embodiments of the present disclosure will be introduced below in conjunction with FIGS. 1A and 1B.

As shown in FIG. 1A, the display panel may comprise a base substrate 11, a first group of light-emitting devices 12, a first group of pixel driving circuits 13, a second group of light-emitting devices 14 and a second group of pixel driving circuits 15.

Referring to FIG. 1B, the base substrate 11 comprises a display area 110. Here, the display area 110 comprises a first display area 1101 and a second display area 1102 other than the first display area 1101. In other words, an area of the display area 110 other than the first display area 1101 is referred to as the second display area 1102. The number of the first display area 1101 may be one or more than one. The shape of the first display area 1101 may be, for example, a square, a circle, or the like. For example, the second display area 1102 may completely surround the first display area 1101. For another example, the second display area 1102 may partially surround the first display area 1101. That is, a part of the edge of the first display area 1101 overlaps with a part of the edge of the display area 111. For example, the first display area 1101 is an area for providing a camera.

It can be understood that, the base substrate 11 may further comprise a peripheral area (not shown in FIG. 1B) surrounding the display area 110. In some embodiments, the base substrate 11 may comprise a flexible substrate. For example, the material of the base substrate 11 may comprise an organic material such as polyimide (PI).

The first group of light-emitting devices 12 is located at the first display area 1101. The first group of light-emitting devices 12 comprises a plurality of first light-emitting devices 120. The first light-emitting device 120 may comprise, for example, an organic light-emitting diode (OLED).

The first group of pixel driving circuits 13 is located at the second display area 1102 and configured to drive at least one first light-emitting device 120 in the plurality of first light-emitting devices 120. Here, the first group of pixel driving circuits 13 comprises at least one first pixel driving circuit 130. The number of the first pixel driving circuits 130 in the first group of pixel driving circuits 13 is smaller than or equal to the number of the first light-emitting devices 120 in the first group of light-emitting devices 12. For example, the first group of light-emitting devices 12 may comprise M (row)×N (column) of first light-emitting devices 120, and the first group of pixel driving circuits 13 may comprise P (row)×Q (column) of first pixel driving circuits 130. N may be an even number or an odd number, and (M×N)/(P×Q) is an integer, for example 1, 2, etc. For example, one first pixel driving circuit 130 may drive one first light-emitting device 120 to emit light. For another example, one first pixel driving circuit 130 may drive two or more first light-emitting devices 120 to emit light.

The second group of light-emitting devices 14 is located at the second display area 1102. The second group of light-emitting devices 14 comprises a plurality of second light-emitting devices 140. The second light-emitting device 140 may comprise, for example, an OLED.

The second group of pixel driving circuits 15 is located at the second display area 1102 and comprises a plurality of second pixel driving circuits 150 configured to drive the plurality of second light-emitting devices 140. The number of the second pixel driving circuits 150 in the second group of pixel driving circuits 15 is smaller than or equal to the number of the second light-emitting devices 140 in the second group of light-emitting devices 14. For example, one second pixel driving circuit 150 may drive one second light-emitting device 140 to emit light. For another example, one second pixel driving circuit 150 may drive two or more second light-emitting devices 140 to emit light.

In a direction perpendicular to the base substrate 11, one group of pixel driving circuits of the first group of pixel driving circuits 13 and the second group of pixel driving circuits 15 are located between the base substrate 11 and the other group of pixel driving circuits of the first group of pixel driving circuits 13 and the second group of pixel driving circuits 15. In other words, in the direction perpendicular to the base substrate 11, the first group of pixel driving circuits 13 and the second group of pixel driving circuits 15 are located in different spaces. In some embodiments, referring to FIG. 1B, the first group of light-emitting devices 12 and the second group of light-emitting devices 14 are located on one side of the first group of pixel driving circuits 13 and the second group of pixel driving circuits 15 away from the base substrate 111.

In some embodiments, referring to FIG. 1A, the first planarization layer PLN1 covers the first group of pixel driving circuits 13, and the second group of pixel driving circuits 15 is located on one side of the first planarization layer PLN1 away from the base substrate 11. The second planarization layer PLN2 covers the second group of pixel driving circuits 15, and the first group of light-emitting devices 12 and the second group of light-emitting devices 14 are located on one side of the second planarization layer PLN2 away from the base substrate 11.

In the above embodiments, on one hand, the first group of pixel driving circuits 13 for driving one or more first light-emitting devices 120 is located at the second display area 1102, thus the light transmittance of an area of the display panel corresponding to the first display area 1101 is increased. On the other hand, in the direction perpendicular to the base substrate 11, the first group of pixel driving circuits 13 and the second group of pixel driving circuits 15 are located in different spaces, thus a greater number of first light-emitting devices 120 can be provided in the first display area 1101, which is favorable for improving the display resolution of the area of the display panel corresponding to the first display area 1101.

It can be understood that, the first pixel driving circuit 130 in the first group of pixel driving circuits 13 and the second pixel driving circuit 150 in the second group of pixel driving circuits 15 may comprise a plurality of thin film transistors and a capacitor. For example, the first pixel driving circuit 130 and the second pixel driving circuit 150 may comprise two thin film transistors and one capacitor (2T1C), six thin film transistors and one capacitor (6T1C), or seven thin film transistors and one capacitor (7T1C). For example, the active layer of each thin film transistor may comprise low-temperature polysilicon (LTPS) or an oxide semiconductor.

In some embodiments, the orthographic projection of the second group of pixel driving circuits 15 on the base substrate 11 does not overlap with the orthographic projection of the first group of pixel driving circuits 13 on the base substrate. Thus, the mutual influence between the second group of pixel driving circuits 15 and the first group of pixel driving circuits 13 can be reduced, which is favorable for improving the display effect of the display panel.

In some embodiments, referring to FIG. 1A, the number of the plurality of second light-emitting devices 140 is greater than that of the plurality of first light-emitting devices 120, and the number of the plurality of second pixel driving circuits 150 is greater than that of the first pixel driving circuit 130 in the first group of pixel driving circuits 13. Moreover, in the direction perpendicular to the base substrate 11, the first group of pixel driving circuits 13 is located between the second group of pixel driving circuits 15 and the base substrate 11. That is, the first group of pixel driving circuits 13 is closer to the base substrate 11 than the second group of pixel driving circuits 15. Such a structure is more favorable for the wiring between the second group of pixel driving circuits 15 and the second group of light-emitting devices 14.

Figure 2:
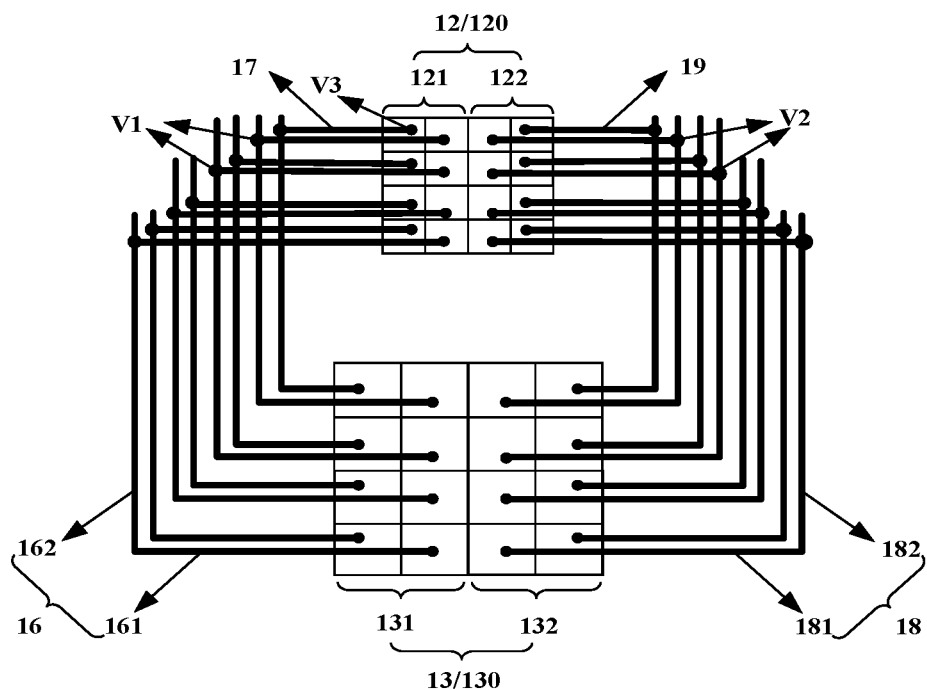
FIG. 2 is a schematic view showing wiring between a first group of light-emitting devices and a first group of pixel driving circuits according to an embodiment of the present disclosure.

FIG. 2 is a schematic view showing wiring between a first group of light-emitting devices and a first group of pixel driving circuits according to an embodiment of the present disclosure.

As shown in FIG. 2, the plurality of first light-emitting devices 120 in the first group of light-emitting devices 12 comprises a first group of first light-emitting devices 121 and a second group of first light-emitting devices 122. The at least one first pixel driving circuit 130 in the first group of pixel driving circuits 13 comprises a first group of first pixel driving circuits 131 and a second group of first pixel driving circuits 132. The first group of first pixel driving circuits 131 is configured to drive the first group of first light-emitting devices 121, and the second group of first pixel driving circuits 132 is configured to drive the second group of first light-emitting devices 122.

As shown in FIG. 2, the display panel further comprises a first group of first signal lines 16, a first group of second signal lines 17, a second group of first signal lines 18 and a second group of second signal lines 19. The first group of first signal lines 16 is electrically connected to the first group of first pixel driving circuits 131; the first group of second signal lines 17 is electrically connected to the first group of first light-emitting devices 121, and electrically connected to the first group of first signal lines 16 through a first group of via holes V1; the second group of first signal lines 18 is electrically connected to the second group of first pixel driving circuits 132; and the second group of second signal lines 19 is electrically connected to the second group of first light-emitting devices 122, and electrically connected to the second group of first signal lines 18 through a second group of via holes V2.

In some embodiments, the materials of the first group of second signal lines 17 and the second group of second signal lines 19 comprise transparent material, such as indium tin oxide (ITO) or the like. In this way, it is favorable for further increasing the light transmittance of the area of the display panel corresponding to the first display area 1101.

In some embodiments, the materials of the first group of first signal lines 16 and the second group of first signal lines 18 comprise metal.

Figure 3A:
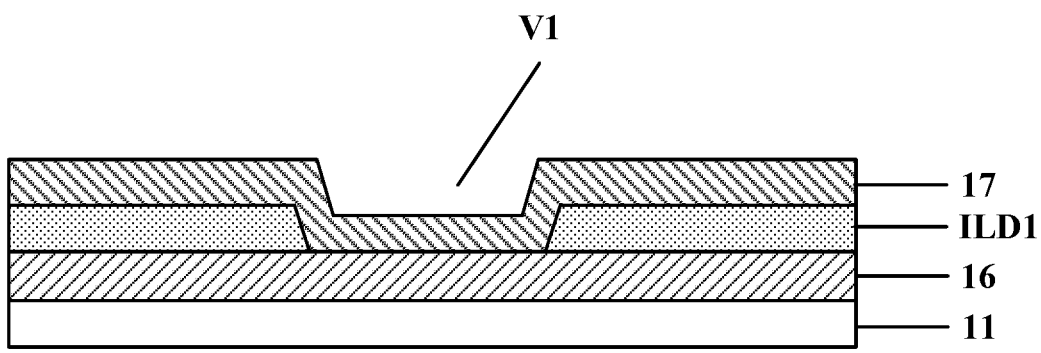
FIGS. 3A-3C are schematic cross-sectional views taken at V1, V2, and V3 shown in FIG. 2 according to some embodiments of the present disclosure.
Figure 3B:
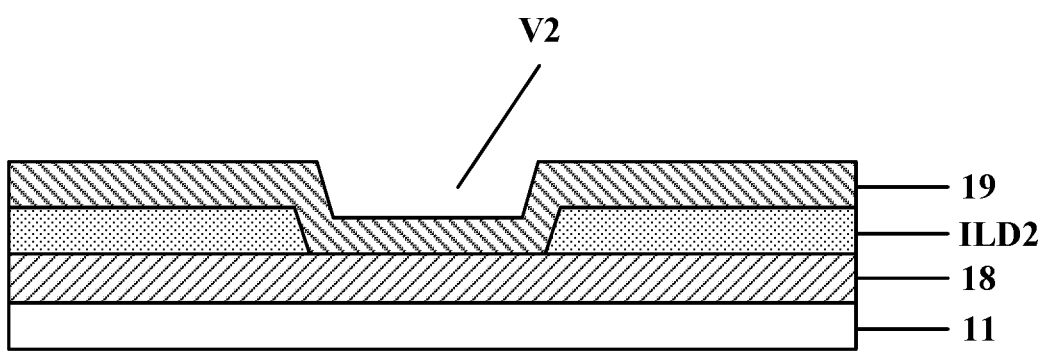
Figure 3C:
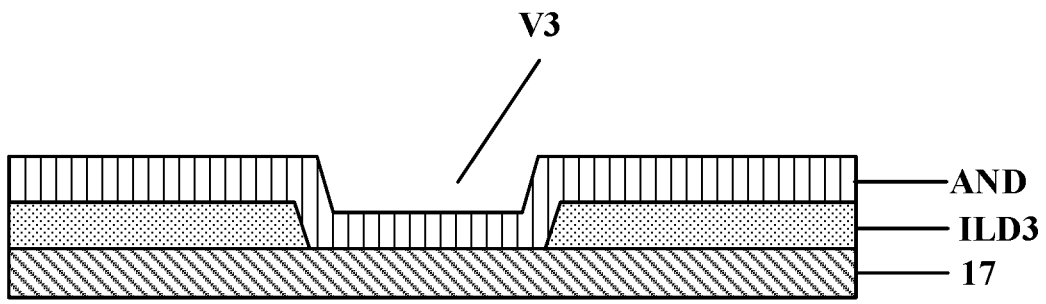

FIGS. 3A-3C are schematic cross-sectional views taken at V1, V2, and V3 shown in FIG. 2 according to some embodiments of the present disclosure.

As shown in FIG. 3A, each second signal line 17 in the first group of second signal lines 17 is electrically connected to a corresponding first signal line 16 in the first group of first signal lines 16 through a via hole V1 penetrating through the insulating layer ILD1. Here, the insulating layer ILD1 may comprise one or more insulating layers.

As shown in FIG. 3B, each second signal line 19 in the second group of second signal lines 19 is electrically connected to a corresponding first signal line 18 in the second group of first signal lines 18 through a via hole V2 penetrating through the insulating layer ILD2 18. Here, the insulating layer ILD2 may comprise one or more insulating layers.

As shown in FIG. 3C, each second signal line 17 in the first group of second signal lines 17 is electrically connected to an anode AND of one first light-emitting device 120 in the first group of first light-emitting devices 121 through a via hole V3 penetrating through the insulating layer ILD3. The insulating layer ILD3 may be, for example, the second planarization layer 120 shown in FIG. 1A.

In some embodiments, referring to FIG. 2, the first group of first signal lines 16 is located on one side of the first group of first pixel driving circuits 131 away from the second group of first pixel driving circuits 132, the first group of second signal lines 17 is located on one side of the first group of first light-emitting devices 121 away from the second group of first light-emitting devices 122, the second group of first signal lines 18 are located on one side of the second group of first pixel driving circuits 132 away from the first group of first pixel driving circuits 131, and the second group of second signal lines 19 is located on one side of the second group of first light-emitting devices 122 away from the first group of first light-emitting devices 121. In this way, the first group of first signal lines 16 and the second group of first signal lines 18 are located on both sides of the first group of pixel driving circuits 13 respectively, and the first group of second signal lines 17 and the second group of second signal lines 19 are located on both sides of the first group of light-emitting devices 12 respectively, which is favorable for reducing the mutual influence among the first group of first signal lines 16, the second group of first signal lines 18, the first group of second signal lines 17 and the second group of second signal lines 19.

In some embodiments, referring to FIG. 2, each first signal line 16 in the first group of first signal lines 16 comprises a first portion 161 and a second portion 162 electrically connected to the first portion 161. The first portion 161 and the second portion 162 may be located in a same layer or may be located in different layers.

It should be noted that, herein, when it is described that two parts are located in a same layer, it means that the two parts are formed by patterning a same material layer; and when it is described that two parts are located in different layers, it means that the two parts are formed by patterning different material layers.

The first portion 161 extends along a first direction and is electrically connected to one first pixel driving circuit 130 in the first group of first pixel driving circuits 131. The second portion 162 extends along a second direction different from the first direction and is electrically connected to one first signal line 17 in the second group of first signal lines 17 through a via hole V1 in the first group of via holes V1. For example, the second direction is perpendicular to the first direction.

In some embodiments, referring to FIG. 2, each first signal lines 18 in the second group of first signal lines 18 comprises a third portion 181 and a fourth portion 182 electrically connected to the third portion 181. The third portion 181 and the fourth portion 182 may be located in a same layer or may be located in different layers.

The third portion 181 extends along the first direction and is electrically connected to one first pixel driving circuit 130 in the second group of first pixel driving circuits 132. The fourth portion 182 extends along the second direction and is electrically connected to one second signal line 19 in the second group of second signal lines 19 through a via hole V2 in the second group of via holes V2.

In some embodiments, referring to FIG. 2, the first group of second signal lines 17 and the second group of second signal lines 19 extend along the first direction.

Figure 4A:
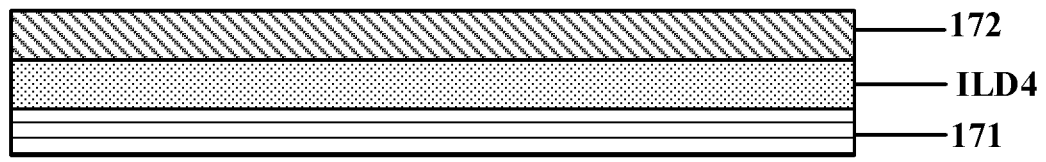
FIG. 4A is a schematic cross-sectional view showing a first group of second signal lines according to an embodiment of the present disclosure.
Figure 4B:
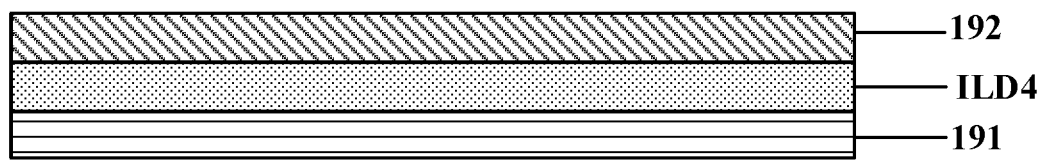
FIG. 4B is a schematic cross-sectional view showing a second group of second signal lines according to an embodiment of the present disclosure.

FIG. 4A is a schematic cross-sectional view showing a first group of second signal lines according to an embodiment of the present disclosure. FIG. 4B is a schematic cross-sectional view showing a second group of second signal lines according to an embodiment of the present disclosure.

In some embodiments, at least one group of second signal lines of the first group of second signal lines 17 or the second group of second signal lines 19 comprises two subgroups of second signal lines located in a same layer.

As shown in FIG. 4A, the first group of second signal lines 17 comprises a first subgroup of second signal lines 171 and a second subgroup of second signal lines 172 located in different layers from the first subgroup of second signal lines 171.

As shown in FIG. 4B, the first group of second signal lines 19 comprises a first subgroup of second signal lines 191 and a second subgroup of second signal lines 192 located in different layers from the first subgroup of second signal lines 191.

For example, referring to FIGS. 4A and 4B, an insulating layer ILD4 may be provided between two subgroups of second signal lines located at different layers.

In this way, it is favorable for reducing the space occupied by at least one group of second signal lines of the first group of second signal lines 17 or the second group of second signal lines 19. Thus, it is possible to provide a greater number of first light-emitting devices 120 in the first display area 1101, which is more favorable for improving the display resolution of the area of the display panel corresponding to the first display area 1101.

Figure 5:
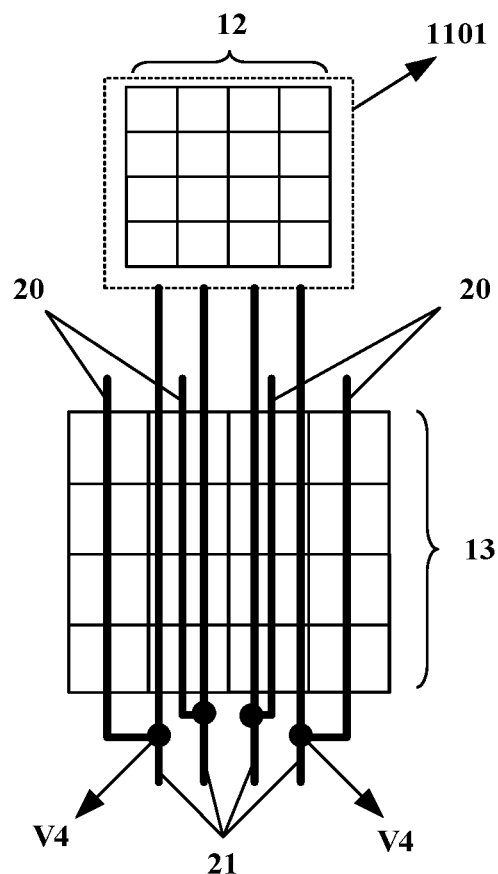
FIG. 5 is a schematic view showing layout of a third signal line and a fourth signal line according to an embodiment of the present disclosure.
Figure 6:
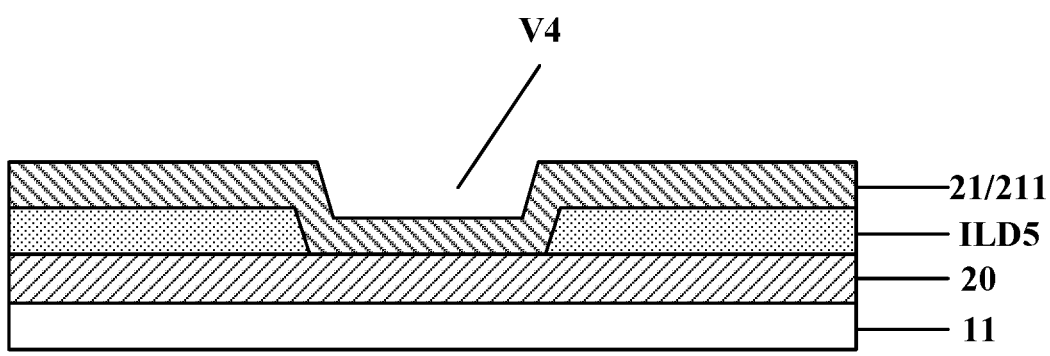
FIG. 6 is a schematic cross-sectional view taken at V4 shown in FIG. 5 according to an embodiment of the present disclosure.

FIG. 5 is a schematic view showing layout of a third signal line and a fourth signal line according to an embodiment of the present disclosure. FIG. 6 is a schematic cross-sectional view taken at V4 shown in FIG. 5 according to an embodiment of the present disclosure.

As shown in FIG. 5, the display panel further comprises a plurality of third signal lines 20 and a plurality of fourth signal lines 21. The plurality of third signal lines 20 is electrically connected to the first group of pixel driving circuits 13, and the plurality of fourth signal lines 21 is electrically connected to the second group of pixel driving circuits 15 shown in FIG. 1A. The plurality of third signal lines 20 and the plurality of fourth signal lines 21 may extend, for example, along the second direction.

The first group of fourth signal lines 211 in the plurality of fourth signal lines 21 is electrically connected to the plurality of third signal lines 20. In other words, some fourth signal lines 211 in the plurality of fourth signal lines 21 are electrically connected to the plurality of third signal lines 20. For example, referring to FIG. 6, the first group of fourth signal lines 211 is electrically connected to the plurality of third signal lines 20 through a fourth group of via holes V4.

In addition, referring to FIG. 6, the first group of fourth signal lines 211 is located in different layers from the plurality of third signal lines 20. For example, an insulating layer ILD5 is provided between the first group of fourth signal lines 211 and the plurality of third signal lines 20. Here, the insulating layer ILD5 may comprise one or more insulating layers.

In some embodiments, the plurality of third signal lines 20 and the plurality of fourth signal lines 21 may comprise at least one of a data line or a power line. For example, a data signal or a power signal can be provided to the first group of pixel driving circuits 13 and some second pixel driving circuits 150 in the second group of pixel driving circuits 15 through the plurality of third signal lines 20 and the first group of fourth signal lines 211.

In some embodiments, the materials of the plurality of third signal lines 20 and the plurality of fourth signal lines 21 comprise metal.

In the above embodiments, the first group of fourth signal lines 211 and the plurality of third signal lines 20 are located in different layers. In this way, the plurality of third signal lines 20 will not occupy the space of the plurality of fourth signal lines 21. Therefore, it is possible to provide a greater number of third signal lines 20, which is more favorable for improving the display resolution of the area of the display panel corresponding to the first display area 1101.

In some embodiments, the orthographic projection of at least one of the second portion 162 or the fourth portion 182 on the base substrate 11 described above does not overlap with the orthographic projections of the plurality of fourth signal lines 21 on the base substrate 11. In this way, the mutual influence between the fourth signal line 21 and at least one of the second portion 162 or the fourth portion 182 can be reduced, thereby reducing crosstalk, and improving the display effect of the display panel.

In some embodiments, the orthographic projection of at least one group of second signal lines of the first group of second signal lines 17 or the second group of second signal lines 19 on the base substrate 11 does not overlap with the orthographic projections of the plurality of fourth signal lines 21 on the base substrate 11. In this way, the mutual influence between the fourth signal line 21 and at least one group of second signal lines of the first group of second signal lines 17 or the second group of second signal lines 19 is reduced, thereby reducing crosstalk, and improving the display effect of the display panel.

In some embodiments, the plurality of third signal lines 20 comprise a plurality of third signal lines of a first type (for example, a data line) and a plurality of third signal lines of a second type (for example, a power line), and the first group of fourth signal lines 211 comprises a plurality of fourth signal lines of the first type (for example, a data line) and a plurality of fourth signal lines of the second type (for example, a power line). The plurality of fourth signal lines of the first type is electrically connected to the plurality of third signal lines of the first type, and the plurality of fourth signal lines of the second type is electrically connected to the plurality of third signal lines of the second type.

In some embodiments, for a signal line of a certain type (for example, a data line), the distance between adjacent third signal lines 20 may be greater than the distance between adjacent fourth signal lines 21 in the first group of fourth signal lines 211. For example, the distance between adjacent third signal lines of the first type in the plurality of third signal lines of the first type is greater than the distance between adjacent fourth signal lines of the first type in the plurality of fourth signal lines of the first type. For another example, the distance between adjacent third signal lines of the second type in the plurality of third signal lines of the second type is greater than the distance between adjacent fourth signal lines of the second type in the plurality of fourth signal lines of the second type.

In this way, since the first group of fourth signal lines 211 and the plurality of third signal lines 20 are located in different layers, the design space for the third signal lines 20 may be greater, which may reduce the mutual influence between adjacent third signal lines 20.

For example, the distance between adjacent third signal lines 20 is substantially equal to the distance between adjacent first pixel driving circuits 131, the distance between adjacent fourth signal lines 21 is substantially equal to the distance between adjacent first light-emitting devices 121, and the distance between adjacent first pixel driving circuits 131 is greater than the distance between adjacent first light-emitting devices 121. For example, the ratio of the distance between adjacent third signal lines 20 to the distance between adjacent first pixel driving circuits 131 is 0.8 to 1.2, for example, is 1, 1.1, etc. For another example, the ratio of the distance between adjacent fourth signal lines 21 to the distance between adjacent first light-emitting devices 121 is 0.8 to 1.2, for example, is 1, 1.1, etc.

In some embodiments, the orthographic projections of the plurality of third signal lines 20 on the base substrate do not overlap with the first display area 1101, and the orthographic projections of the plurality of fourth signal lines 21 on the base substrate do not overlap with the first display area 1101. In this way, the light transmittance of the area of the display panel corresponding to the first display area 1101 can be further increased.

Figure 7:
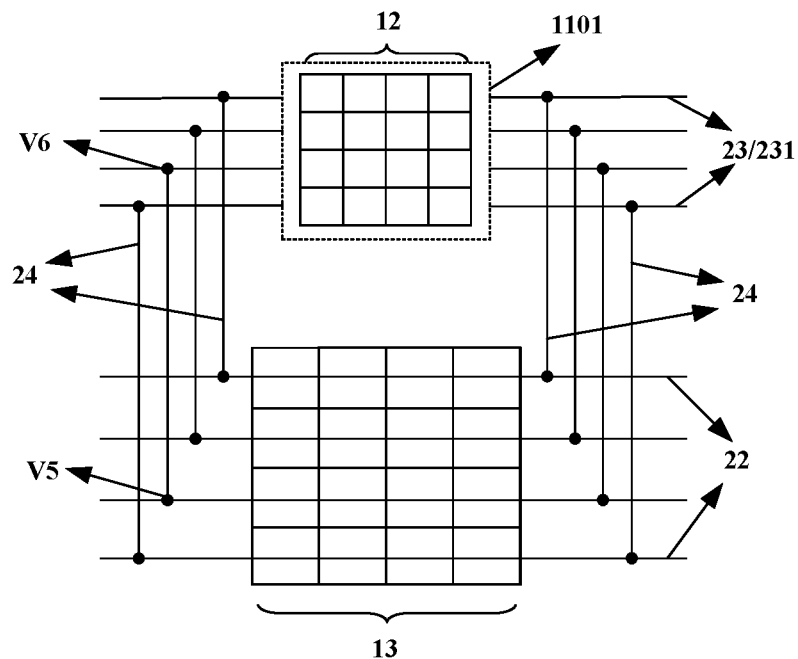
FIG. 7 is a schematic view showing layout of a fifth signal line, a sixth signal line, and a seventh signal line according to an embodiment of the present disclosure.

FIG. 7 is a schematic view showing layout of a fifth signal line, a sixth signal line, and a seventh signal line according to an embodiment of the present disclosure.

As shown in FIG. 7, the display panel further comprises a plurality of fifth signal lines 22, a plurality of sixth signal lines 23 and a plurality of seventh signal lines 24. In some embodiments, the plurality of fifth signal lines 22, the plurality of sixth signal lines 23 and the plurality of seventh signal lines 24 comprise at least one of a gate line, a light-emitting control line, a reset line, or an initialization line. For example, a gate signal, a light-emitting control signal, a reset signal, or an initialization signal is supplied to the first group of pixel driving circuits 13 and the second group of pixel driving circuits 15 through the plurality of fifth signal lines 22, the plurality of sixth signal lines 23 and the plurality of seventh signal lines 24.

The plurality of fifth signal lines 22 is electrically connected to the first group of pixel driving circuits 13 and extend along a first direction. The orthographic projections of the plurality of fifth signal lines 22 on the base substrate 11 overlap with the orthographic projections of the first group of pixel driving circuits 13 on the base substrate 11.

The plurality of sixth signal lines 23 is electrically connected to the second group of pixel driving circuits 15 and extend along the first direction. The orthographic projections of the plurality of sixth signal lines 23 on the base substrate 11 do not overlap with the first display area 1101. For example, in the first direction, a plurality of sixth signal lines 23 is provided on each side of both sides of the first display area 1101 respectively.

The plurality of seventh signal lines 24 is electrically connected between the plurality of fifth signal lines 22 and a first group of sixth signal lines 231 in the plurality of sixth signal lines 23 and extend along a second direction different from the first direction. For example, the plurality of seventh signal lines 24 is electrically connected to the plurality of fifth signal lines 22 through a fifth group of via holes V5, and electrically connected to the first group of sixth signal lines 231 through a sixth group of via holes V6.

In some embodiments, the materials of the plurality of fifth signal lines 22, the plurality of sixth signal lines 23 and the plurality of seventh signal lines 24 comprise metal.

In the above embodiments, the orthographic projections of the plurality of sixth signal lines 23 on the base substrate 11 do not overlap with the first display area 1101, which can further increase the light transmittance of the area of the display panel corresponding to the first display area 1101.

In some embodiments, the orthographic projection of at least one of the first portion 161 or the third portion 181 on the base substrate 11 described above does not overlap with the orthographic projections of the plurality of fifth signal lines 22 on the base substrate 11. In this way, the mutual influence between the plurality of fifth signal lines 22 and at least one of the first portion 161 or the third portion 181 is reduced, thereby reducing crosstalk, and improving the display effect of the display panel.

In some embodiments, the orthographic projection of at least one of the second portion 162 or the fourth portion 182 on the base substrate 11 described above does not overlap with the orthographic projections of the plurality of seventh signal lines 24 on the base substrate 11. In this way, the mutual influence between at least one of the second portion 162 and the fourth portion 182 and the seventh signal line 24 is reduced, thereby reducing crosstalk, and improving the display effect of the display panel.

Figure 8A:
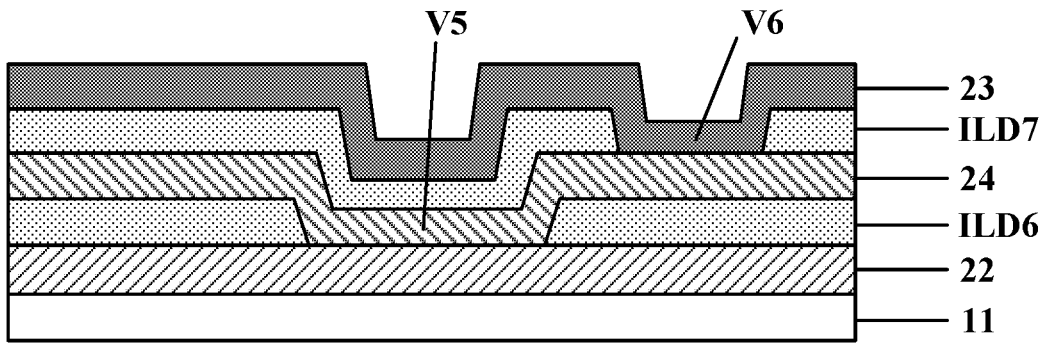
FIGS. 8A and 8B are schematic cross-sectional views taken at V5 and V6 shown in FIG. 7 according to some implementations of the present disclosure.
Figure 8B:
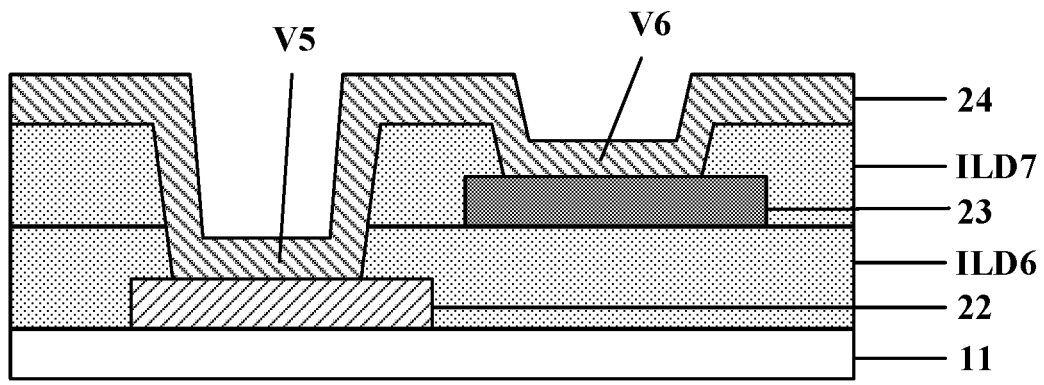

FIGS. 8A and 8B are schematic cross-sectional views taken at V5 and V6 shown in FIG. 7 according to some implementations of the present disclosure.

As some implementations, as shown in FIG. 8A, in the direction perpendicular to the base substrate 11, the plurality of seventh signal lines 24 is located between the plurality of fifth signal lines 22 and the plurality of sixth signal lines 23. The plurality of seventh signal lines 24 is electrically connected to the plurality of fifth signal lines 22 through the fifth group of via holes V5 penetrating through the insulating layer ILD6, and electrically connected to the plurality of sixth signal lines 23 through the sixth group of via holes V6 penetrating through the insulating layer ILD7.

As other implementations, as shown in FIG. 8B, in the direction perpendicular to the base substrate 11, the plurality of sixth signal lines 23 is located between the plurality of fifth signal lines 22 and the plurality of seventh signal lines 24. The plurality of seventh signal lines 24 is electrically connected to the plurality of fifth signal lines 22 through the fifth group of via holes V5 penetrating through the insulating layer ILD6 and the insulating layer ILD7, and electrically connected to the plurality of sixth signal lines 23 through the sixth group of via holes V6 penetrating through the insulating layer ILD7.

In some embodiments, referring to FIGS. 8A and 8B, the plurality of seventh signal lines 24 is located in different layers from the plurality of fifth signal lines 22, and the plurality of seventh signal lines 24 is located in different layers from the plurality of sixth signal lines 23. In this way, it is favorable for reducing the space occupied by the plurality of seventh signal lines 24.

In some embodiments, the orthographic projection of each seventh signal line 24 in the plurality of seventh signal lines 24 on the base substrate 11 overlaps with the orthographic projection of at least one fifth signal line 22 in the plurality of fifth signal lines 22 on the base substrate 11, and overlaps with the orthographic projection of at least one sixth signal line 23 in the plurality of sixth signal lines 23 on the base substrate 11. In this way, the seventh signal line 24 may be provided to overlap with the fifth signal line 22 and the sixth signal line 23, which is favorable for reducing the space occupied by the seventh signal lines 24.

Figure 9:
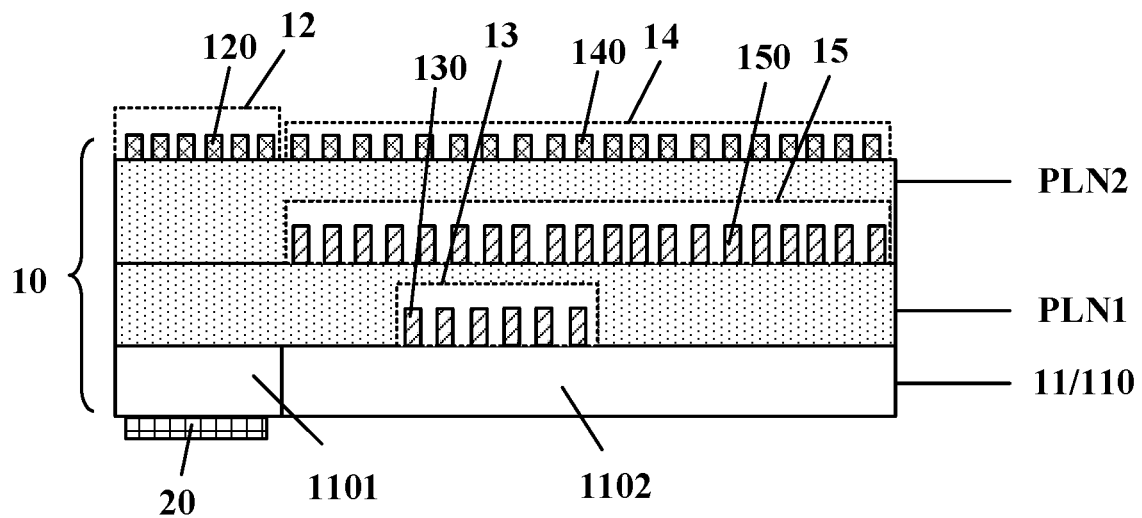
FIG. 9 is a schematic structural view showing a display device according to an embodiment of the present disclosure.

FIG. 9 is a schematic structural view showing a display device according to an embodiment of the present disclosure.

As shown in FIG. 9, the display device may comprise the display panel 10 according to any one of the above embodiments. In some embodiments, referring to FIG. 9, the display device further comprises a camera 20 located at the first display area 1101, and located on one side of the base substrate 11 away from the first group of light-emitting devices 120.

In some embodiments, the display device may be any product or component with a display function, for example, a mobile terminal (for example, a smart phone, or a tablet computer), a television, a monitor, a notebook computer, a digital photo frame, a navigator, an electronic paper, or the like.

Figure 10:
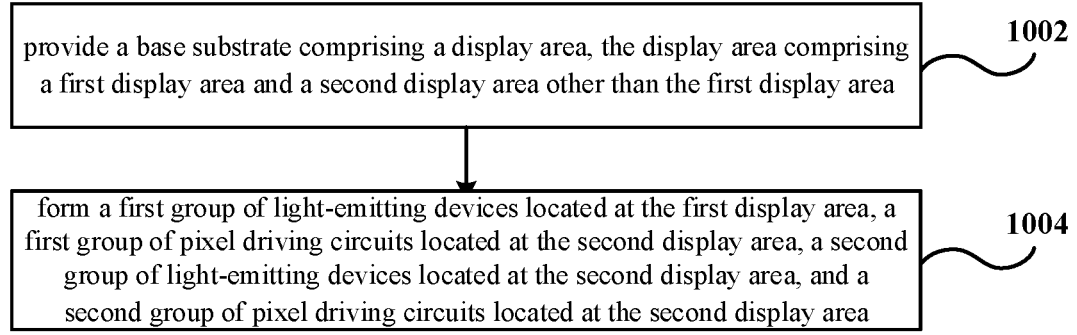
FIG. 10 is a schematic flowchart showing a manufacturing method of a display panel according to an embodiment of the present disclosure.

FIG. 10 is a schematic flowchart showing a manufacturing method of a display panel according to an embodiment of the present disclosure.

At step 1002, a base substrate is provided. Here, the base substrate comprises a display area which comprises a first display area and a second display area other than the first display area.

At step 1004, a first group of light-emitting devices located at the first display area, a first group of pixel driving circuits located at the second display area, a second group of light-emitting devices located at the second display area, and a second group of pixel driving circuits located at the second display area are formed.

The first group of light-emitting devices comprises a plurality of first light-emitting devices, and the second group of light-emitting devices comprises a plurality of second light-emitting devices. The first group of pixel driving circuits is configured to drive at least one of the plurality of first light-emitting devices and comprises at least one pixel driving circuit. The second group of pixel driving circuits comprises a plurality of second pixel driving circuits configured to drive the plurality of second light-emitting devices.

In the direction perpendicular to the base substrate, one group of pixel driving circuits of the first group of pixel driving circuits and the second group of pixel driving circuits is located between the base substrate and the other group of pixel driving circuits of the first group of pixel driving circuits and the second group of pixel driving circuits.

In the above embodiments, on one hand, the first group of pixel driving circuits for driving one or more first light-emitting devices is located at the second display area, thus the light transmittance of an area of the display panel corresponding to the first display area is increased. On the other hand, in the direction perpendicular to the base substrate, the first group of pixel driving circuits and the second group of pixel driving circuits are located in different spaces, thus a greater number of first light-emitting devices can be provided in the first display area, which is favorable for improving the display resolution of the area of the display panel corresponding to the first display area.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A display panel, comprising:
a base substrate comprising a display area, wherein the display area comprises a first display area and a second display area other than the first display area;
a first group of light-emitting devices located at the first display area, and comprising a plurality of first light-emitting devices;
a first group of pixel driving circuits located at the second display area, configured to drive at least one of the plurality of first light-emitting devices, and comprising at least one first pixel driving circuit;
a second group of light-emitting devices located at the second display area, and comprising a plurality of second light-emitting devices; and
a second group of pixel driving circuits located at the second display area, and comprising a plurality of second pixel driving circuits configured to drive the plurality of second light-emitting devices,
wherein in a direction perpendicular to the base substrate, one group of pixel driving circuits of the first group of pixel driving circuits and the second group of pixel driving circuits is located between the base substrate and the other group of pixel driving circuits of the first group of pixel driving circuits and the second group of pixel driving circuits, and
wherein orthographic projections of the second group of pixel driving circuits on the base substrate does not overlap with that of the first group of pixel driving circuits on the base substrate.

2. The display panel according to claim 1, wherein:
the plurality of first light-emitting devices comprises a first group of first light-emitting devices and a second group of first light-emitting devices;
the at least one first pixel driving circuit comprises:
a first group of first pixel driving circuits configured to drive the first group of first light-emitting devices, and
a second group of first pixel driving circuits configured to drive the second group of first light-emitting devices; and
the display panel further comprises:
a first group of first signal lines electrically connected to the first group of first pixel driving circuits,
a first group of second signal lines electrically connected to the first group of first light-emitting devices and electrically connected to the first group of first signal lines through a first group of via holes,
a second group of first signal lines electrically connected to the second group of first pixel driving circuits, and
a second group of second signal lines electrically connected to the second group of first light-emitting devices, and electrically connected to the second group of first signal lines through a second group of via holes.

3. The display panel according to claim 2, wherein at least one group of second signal lines of the first group of second signal lines or the second group of second signal lines comprises:

a first subgroup of second signal lines; and
a second subgroup of second signal lines located in different layers from the first subgroup of second signal lines.

4. The display panel according to claim 2, wherein:
the first group of first signal lines is located on one side of the first group of first pixel driving circuits away from the second group of first pixel driving circuits;
the first group of second signal lines is located on one side of the first group of first light-emitting devices away from the second group of first light-emitting devices;
the second group of first signal lines is located on one side of the second group of first pixel driving circuits away from the first group of first pixel driving circuits; and
the second group of second signal lines is located on one side of the second group of first light-emitting devices away from the first group of first light-emitting devices.

5. The display panel according to claim 2, wherein each of the first group of first signal lines comprises:
a first portion extending along a first direction, and electrically connected to one first pixel driver circuit in the first group of first pixel driver circuits; and
a second portion electrically connected to the first portion, extending along a second direction different from the first direction, and electrically connected to one second signal line in the first group of second signal lines through one via hole in the first group of via holes.

6. The display panel according to claim 5, wherein each of second group of first signal lines comprises:
a third portion extending along the first direction, and electrically connected to one first pixel driving circuit in the second group of first pixel driving circuits; and
a fourth portion electrically connected to the third portion, extending along the second direction, and electrically connected to one second signal line in the second group of second signal lines through one via hole in the second group of via holes.

7. The display panel according to claim 5, wherein the first group of second signal lines and the second group of second signal lines extend along the first direction.

8. The display panel according to claim 1, further comprising:
a plurality of third signal lines electrically connected to the first group of pixel driving circuits; and
a plurality of fourth signal lines electrically connected to the second group of pixel driving circuits, wherein a first group of fourth signal lines in the plurality of fourth signal lines is electrically connected to the plurality of third signal lines and located in different layers from the plurality of third signal lines.

9. The display panel according to claim 8, wherein:
orthographic projections of the plurality of third signal lines on the base substrate do not overlap with the first display area; and
orthographic projections of the plurality of fourth signal lines on the base substrate do not overlap with the first display area.

10. The display panel according to claim 8, wherein:
the plurality of third signal lines comprises a plurality of third signal lines of a first type and a plurality of third signal lines of a second type; and
the first group of fourth signal lines comprises a plurality of fourth signal lines of the first type and a plurality of fourth signal lines of the second type, wherein the plurality of fourth signal lines of the first type is electrically connected to the plurality of third signal lines of the first type, and the plurality of fourth signal lines of the second type is electrically connected to the plurality of third signal lines of the second type.

11. The display panel according to claim 10, wherein:
a distance between adjacent third signal lines of the first type in the plurality of third signal lines of the first type is greater than a distance between adjacent fourth signal lines of the first type in the plurality of fourth signal lines of the first type; and
a distance between adjacent third signal lines of the second type in the plurality of third signal lines of the second type is greater than a distance between adjacent fourth signal lines of the second type in the plurality of fourth signal lines of the second type.

12. The display panel according to claim 1, further comprising:
a plurality of fifth signal lines electrically connected to the first group of pixel driving circuits and extending along a first direction, wherein orthographic projections of the plurality of fifth signal lines on the base substrate overlap with an orthographic projection of the first group of pixel driving circuits on the base substrate;
a plurality of sixth signal lines electrically connected to the second group of pixel driving circuits and extending along the first direction, wherein orthographic projections of the plurality of sixth signal lines on the base substrate do not overlap with the first display area; and
a plurality of seventh signal lines electrically connected between the plurality of fifth signal lines and a first group of sixth signal lines in the plurality of sixth signal lines, the plurality of seventh signal lines extending along a second direction different from the first direction.

13. The display panel according to claim 12, wherein the plurality of seventh signal lines is located in different layers from the plurality of fifth signal lines, and the plurality of seventh signal lines is located in different layers from the plurality of sixth signal lines.

14. The display panel according to claim 13, wherein an orthographic projection of each of the plurality of seventh signal lines on the base substrate overlaps with an orthographic projection of at least one of the plurality of fifth signal lines on the base substrate, and overlaps with an orthographic projection of at least one of plurality of sixth signal lines on the base substrate.

15. The display panel according to claim 12, wherein the plurality of fifth signal lines, the plurality of sixth signal lines and the plurality of seventh signal lines comprise at least one of a gate line, a light-emitting control line, a reset line, or an initialization line.

16. The display panel according to claim 1, wherein:
a number of the plurality of second light-emitting devices is greater than a number of the plurality of first light-emitting devices;
a number of the plurality of second pixel driving circuits is greater than a number of the at least one first pixel driving circuit; and
in the direction perpendicular to the base substrate, the first group of pixel driving circuits is located between the second group of pixel driving circuits and the base substrate.

17. A display device, comprising the display panel according to claim 1.

18. The display device according to claim 17, further comprising:
a camera located on one side of the base substrate away from the first group of light-emitting devices and located at the first display area.

19. A manufacturing method of a display panel, comprising:
providing a base substrate comprising a display area, wherein the display area comprises a first display area and a second display area other than the first display area; and
forming a first group of light-emitting devices located at the first display area, a first group of pixel driving circuits located at the second display area, a second group of light-emitting devices located at the second display area, and a second group of pixel driving circuits located at the second display area, wherein:
the first group of light-emitting devices comprises a plurality of first light-emitting devices,
the first group of pixel driving circuits is configured to drive at least one of the plurality of first light-emitting devices, and comprises at least one first pixel driving circuit,
the second group of light-emitting devices comprises a plurality of second light-emitting devices,
the second group of pixel driving circuits comprises a plurality of second pixel driving circuits configured to drive the plurality of second light-emitting devices, and
in a direction perpendicular to the base substrate, one group of pixel driving circuits of the first group of pixel driving circuits and the second group of pixel driving circuits is located between the base substrate and the other group of pixel driving circuits of the first group of pixel driving circuits and the second group of pixel driving circuits, and
orthographic projections of the second group of pixel driving circuits on the base substrate does not overlap with that of the first group of pixel driving circuits on the base substrate.

20. A display panel, comprising:
a base substrate comprising a display area, wherein the display area comprises a first display area and a second display area other than the first display area;
a first group of light-emitting devices located at the first display area, and comprising a plurality of first light-emitting devices, the plurality of first light-emitting devices comprising a first group of first light-emitting devices and a second group of first light-emitting devices;
a first group of pixel driving circuits located at the second display area, configured to drive at least one of the plurality of first light-emitting devices, and comprising a first group of first pixel driving circuits configured to drive the first group of first light-emitting devices, and a second group of first pixel driving circuits configured to drive the second group of first light-emitting devices;
a second group of light-emitting devices located at the second display area, and comprising a plurality of second light-emitting devices;
a second group of pixel driving circuits located at the second display area, and comprising a plurality of second pixel driving circuits configured to drive the plurality of second light-emitting devices;
a first group of first signal lines electrically connected to the first group of first pixel driving circuits;
a first group of second signal lines electrically connected to the first group of first light-emitting devices and electrically connected to the first group of first signal lines through a first group of via holes;
a second group of first signal lines electrically connected to the second group of first pixel driving circuits; and a second group of second signal lines electrically connected to the second group of first light-emitting devices, and electrically connected to the second group of first signal lines through a second group of via holes, wherein in a direction perpendicular to the base substrate, one group of pixel driving circuits of the first group of pixel driving circuits and the second group of pixel driving circuits is located between the base substrate and the other group of pixel driving circuits of the first group of pixel driving circuits and the second group of pixel driving circuits.

\* \* \* \* \*